(12) United States Patent
Inaba et al.

(10) Patent No.: US 6,188,013 B1
(45) Date of Patent: *Feb. 13, 2001

(54) SOLAR CELL

(75) Inventors: Atsushi Inaba; Katsuhiko Takebe; Yamato Ishikawa, all of Saitama (JP)

(73) Assignee: Honda Giken Kogyo Kabushiki Kaisha, Tokyo (JP)

( * ) Notice: Under 35 U.S.C. 154(b), the term of this patent shall be extended for 0 days.

This patent is subject to a terminal disclaimer.

(21) Appl. No.: 09/322,958

(22) Filed: May 28, 1999

(30) Foreign Application Priority Data

Sep. 7, 1998 (JP) .................................. 10-268962

(51) Int. Cl.$^7$ .................................. H01L 31/00
(52) U.S. Cl. .................. 136/256; 136/262; 136/264
(58) Field of Search ........................... 136/256, 262, 136/264

(56) References Cited

U.S. PATENT DOCUMENTS

| 5,356,839 | 10/1994 | Tuttle et al. | 437/225 |
| 6,020,556 | * 2/2000 | Inaba et al. | 136/256 |

FOREIGN PATENT DOCUMENTS

| 59-115576 | 7/1984 | (JP) . |
| 60-035554 | 2/1985 | (JP) . |
| 2016776 | 1/1990 | (JP) . |
| 4223378 | 8/1992 | (JP) . |
| 5259487 | 10/1993 | (JP) . |
| 6029560 | 2/1994 | (JP) . |
| 6196743 | 7/1994 | (JP) . |
| 6268241 | 9/1994 | (JP) . |

* cited by examiner

Primary Examiner—Mark Chapman
(74) Attorney, Agent, or Firm—Carrier, Blackman & Associates, P.C.; Joseph P. Carrier; William D. Blackman

(57) ABSTRACT

A solar cell comprising a substrate of insulating material, a bottom side electrode layer formed on one surface of the substrate, a semiconductor photoelectric conversion layer formed on the bottom side electrode layer, a transparent top side electrode layer formed on the semiconductor photoelectric conversion layer and a non-transparent electrode comprising a plurality of strips of non-transparent conductive layers disposed separately from each other on the top side transparent electrode layer. The solar cell further comprises an additional bottom side electrode layer formed on the opposite surface of the substrate and a plurality of conductive paths connecting the bottom side electrode layer to the additional bottom side electrode layer through holes or slits formed to penetrate the substrate.

19 Claims, 2 Drawing Sheets

SOLAR CELL

FIELD OF THE INVENTION

The present invention is related in general to a solar cell and more particularly to a solar cell having an improved electrode structure.

BACKGROUND OF THE INVENTION

The thin film semiconductor solar cell of copper-indium-gallium-selenide (Cu,In,Ga,Se) having the chalcopyrite structure has been studied in recent years as is shown in some patent applications such as WO94/24696, WO96/06454. The structure of the solar cell is shown in FIG. 3 in which on a glass substrate 9, a bottom side electrode layer 2 of molybdenum (Mo), a photoelectric semiconductor layer of Cu,In,Ga,Se 1, a buffer layer of CdS 4 and a top side electrode layer 3 are formed sequentially. The top side electrode layer 3 is made by forming transparent electrode layers of ZnO, ZnO/Al 3a,3b on the buffer layer 4 sequentially, and by forming an Al electrode 3c comprising a plurality of separated strips 3c1,3c2 of non-transparent conductive layers.

The molybdenum is selected as a material to form the bottom side electrode layer 2, because the Cu(In,Ga)Se2 photoelectric semiconductor layer 1 of the good quality can be formed on it. The soda-lime silica glass is one of suitable materials for the glass substrate 9. One reason why it is suitable for the glass substrate is that it has almost an equal thermal expansion coefficient to that of the Cu(In,Ga)Se2 semiconductor layer 1 which results in the reduction of the thermal strain in the stacked composite structure to improve the reliability of the solar cell.

The strips 3c1,3c2 of the non-transparent conductive layers of the top side electrode 3c are extended in the direction diagonal to the cross section keeping an appropriate predetermined distance between each other. The width of each of the strips of the electrode layers 3c should be made as large as possible to decrease the resistance of the electrode. However, their width should be made as small as possible to minimize the amount of the solar light which will be reflected by them. Accordingly, their width, more precisely, the ratio of their width to their distance, should be determined to be the optimum value considering both factors.

The conventional solar cell shown in FIG. 3 has a problem that the Joule loss becomes large in the electrode layer 2, because the material molybdenum has high electrical resistance. As a result, the efficiency of photoelectric energy conversion of the solar cell will be decreased.

In the conventional solar cell shown in FIG. 3, so called scribing method has been applied to make the electrical connection to the bottom side electrode layer 2 at it's peripheral area. In the scribing method, the top side electrode layer 3 and the semiconductor photoelectric conversion layer 1 at the peripheral area of the bottom side electrode layer 2 will be removed by scratching and breaking the overlying layers 1,3 using a sharp metal claw to expose the underlying electrode layer 2. However, this scribing method is difficult because only the very thin underlying electrode layer 2 must be left exposed without suffering substantial damage, which results in decrease of the yield of the fabrication.

SUMMARY OF THE INVENTION

Accordingly, it is an object of this invention to provide a solar cell having a bottom electrode layer of low resistivity to reduce Joule loss, which thereby results in the high photoelectric conversion efficiency of the cell.

It is also an object of this invention to provide a solar cell of high fabrication yield, to thereby cause a low manufacturing cost.

These and other objects of the present invention are achieved by the solar cell of this invention comprising: a substrate formed of insulator material; a bottom side electrode layer formed on one side of said substrate; a semiconductor photoelectric conversion layer formed on said bottom side electric layer; a transparent top side electrode layer formed on said semiconductor photoelectric conversion layer; a non-transparent electrode comprising a plurality of strips of non-transparent conductive layers disposed separately form each other on said top side transparent electrode layer; an additional bottom side electrode layer formed on an opposite side of said substrate and a plurality of conductive paths connecting said bottom side electrode layer and said additional bottom side electrode layer through holes or slits formed to penetrate said substrate.

DETAILED DESCRIPTION OF THE PREFERRED EMBODIMENTS

Figure 1:
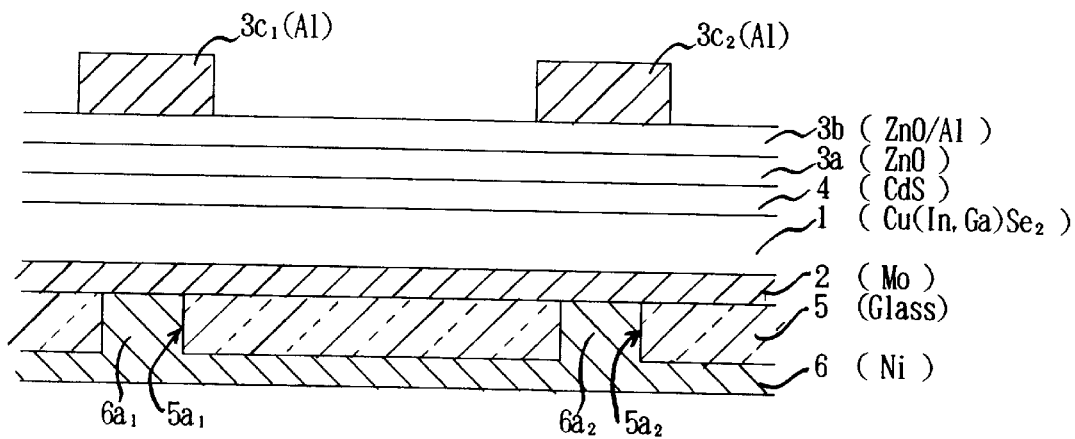
FIG. 1 is a cross-sectional view illustrating a structure of a solar cell according to a first preferred embodiment of the present invention.

The present invention will now be described more fully hereinafter with reference to Figures. FIG. 1 is a cross-sectional view illustrating a structure of a solar cell according to a preferred embodiment of the present invention.

On a glass substrate 5 comprising glass such as soda-lime silica glass, a bottom side electrode layer 2 of molybdenum (Mo) and a semiconductor photoelectric conversion layer of Cu,In,Ga,Se 1 are formed sequentially. On the photoelectric conversion layer 1, a buffer layer of CdS 4 and a top side electrode layer 3 are formed sequentially.

The top side electrode layer 3 is made by forming transparent electrode layers of ZnO, ZnO/Al 3a,3b on the buffer layer 4, then forming an Al electrode 3c on the layers 3a,3b. The electrode 3c comprises a plurality of strips of non-transparent conductive layers 3c1,3c2 . . . extending along the direction perpendicular to the cross section, and disposed separately by keeping a predetermined distance from each other.

A plurality of through holes or slits 5a1,5a2 . . . are formed inside the glass substrate 5. The through holes 5a1,5a2 . . . can be formed by using any appropriate method. For example, they can be formed mechanically using a drill, a water jet or a laser beam etc. They can be formed chemically using wet or dry etching techniques commonly used in IC fabrication processes. The through holes 5a1, 5a2 . . . are formed to locate separately keeping an appropriate distance between each other along the direction perpendicular to the cross-section as shown.

An additional bottom side electrode 6 is formed on the bottom surface of the glass substrate 5. The additional electrode 6 can be made of appropriate conductive material such as metal, for example, nickel (Ni), gold (Au), etc. The additional electrode 6 can be formed in various way such as electroless plating, sputtering etc. In this preferred embodiment the additional electrode 6 is formed by plating nickel on the bottom surface of the glass substrate using the electroless plating. In the preferred electroless plating process, nickel is also plated on the surface of each of the through holes 5$a$1,5$a$2 . . . completely filling the through holes to form conductive paths 6$a$1,6$a$2 . . .

After the additional bottom side electrode 6 and conductive paths 6$a$1,6$a$2 . . . are formed on the bottom surface and inside the through holes 5$a$1,5$a$2 . . . of the glass substrate 5, respectively, the bottom side electrode layer 2 is formed by depositing the molybdenum on the top surface of the glass substrate 5. The deposition of the molybdenum can be performed using any appropriate conventional technique such as sputtering, evaporation, etc.

On the bottom side electrode layer 2, the semiconductor photoelectric conversion layer 1, the buffer layer 4 and the top side electrode layer 3 are formed sequentially, using appropriate conventional method(s) commonly used to form thin film layers in the semiconductor IC process.

The bottom side electrode layer 2 of the molybdenum of high resistivity is connected to the additional electrode 6 of the nickel of low resistivity through the conductive paths 6$a$1,6$a$2 . . . formed in the through holes 5$a$1,5$a$2 . . . forming a composite or integrated bottom side electrode. As a result, the resistivity of the composite or integrated bottom side electrode can be made low enough to reduce the Joule loss greatly, which makes it possible to increase the photoelectric conversion efficiency of the solar cell.

Figure 2:
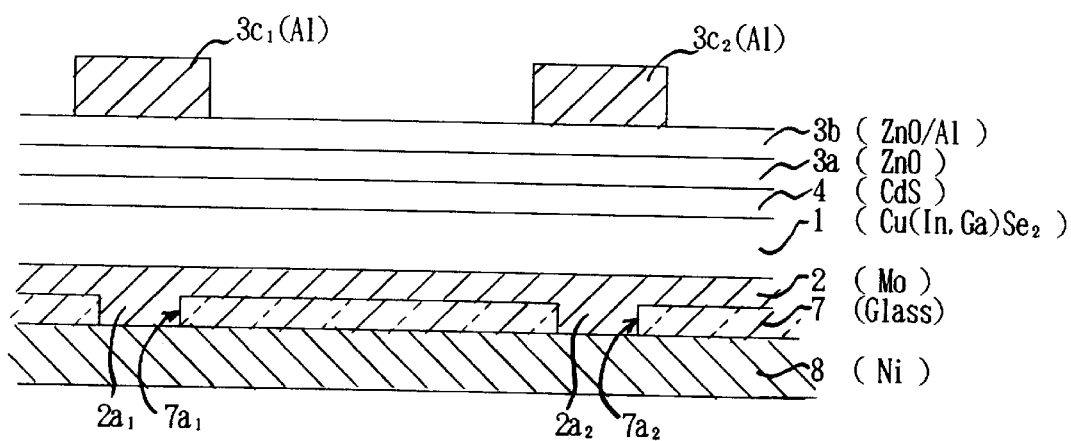
FIG. 2 is a cross-sectional view illustrating a structure of a solar cell according to a second preferred embodiment of the present invention.
Figure 3:
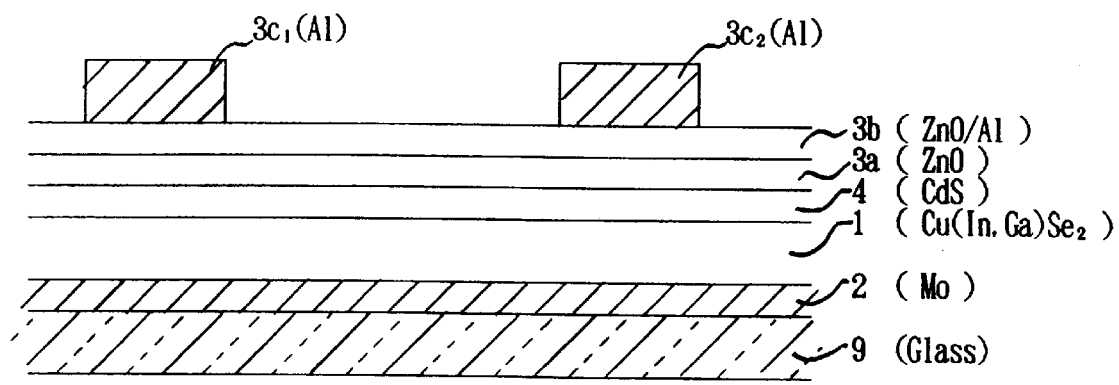
FIG. 3 is a cross-sectional view illustrating a structure of a conventional solar cell according to a prior art.

FIG. 2 is a cross-sectional view illustrating a structure of a solar cell according to another preferred embodiment of the present invention. The general structure of this solar cell is the same as that shown in FIG. 1, because it also comprises a glass substrate 7, a bottom side electrode layer 2 of molybdenum, a semiconductor photoelectric conversion layer 1 of Cu,In,Ga,Se, a buffer layer 4 of CdS, a top side electrode layer 3 including the transparent electrode layers 3$a$, 3$b$, and the strips of non-transparent conductive layers 3$c$1,3$c$2 . . . and an additional bottom side electrode layer 8.

In this embodiment, the additional bottom side electrode 8 is made of a thick metal plate such as nickel plate. On the bottom side electrode 8, the layer of glass 7 such as a layer of soda-lime silica glass containing sodium (Na) is formed. Then a plurality of slits 7$a$1,7$a$2 . . . are formed which penetrate the glass layer 7 and are spaced predetermined distance each other. This process can be performed using appropriate conventional methods as described above relating to the first embodiment.

On the glass layer 7, a bottom side electrode layer 2 of molybdenum is formed using an appropriate conventional method such as sputtering, evaporation, etc. In this process, the slits 7$a$1,7$a$2 . . . are filled with the molybdenum supplied on the surface of the glass layer 7 to form conductive paths 2$a$1,2$a$2 . . . for connecting the bottom side electrode layer 2 to the additional bottom side electrode layer 8, again, forming a composite of integrated bottom side electrode.

On the bottom side electrode layer 2, the semiconductor photoelectric conversion layer 1, the buffer layer 4 and the top side electrode layer 3 are formed sequentially. In these processes, each of the strips of the conductive layers 3$c$1, 3$c$2 . . . of the non-transparent electrode 3$c$ are located just or directly above each of the conductive paths 2$a$1, 2$a$2 . . . , respectively in the same horizontal positions.

The resistance of the composite or integrated bottom side electrode, including the layers 2 and 8 connected by the conductive paths 2$a$1,2$a$2 . . . , is decreased by adding the additional bottom side electrode 8 to improve photoelectric conversion efficiency of the solar cell.

Although the invention has been described above with reference to only a limited number of presently preferred embodiments, these embodiments are not intended to limit the scope of the invention. Many modifications and variations are possible within the scope of this invention as indicated by the appended claims.

For example, the invention can be applied to the cases in which other metals or semiconductors of high resistivity are used instead of the molybdenum as a material of the bottom side electrode layer, or in the case in which high resistivity metal is used but the resistivity of the bottom side electrode layer becomes low because the thickness of the layer is be made very small.

All such modifications and variations that may be apparent to an ordinary person skilled in the art are Intended to be within the scope of this invention.

What is claimed is:

1. A solar cell comprising:
   a substrate of insulating material;
   a bottom side electrode layer formed on one surface of said substrate;
   a semiconductor photoelectric conversion layer formed on said bottom side electrode layer;
   a transparent top side electrode layer formed on said semiconductor photoelectric conversion layer;
   a non-transparent electrode comprising a plurality of strips of non-transparent conductive layers disposed separately from each other on said top side transparent electrode layer;
   an additional bottom side electrode layer formed on an opposite surface of said substrate; and
   a plurality of conductive paths connecting said bottom side electrode layer to said additional bottom side electrode layer through holes formed to penetrate said substrate.

2. A solar cell according to claim 1 further comprising a buffer layer formed between said semiconductor photoelectric layer and said electrode transparent top side layer.

3. A solar cell according to claim 1 wherein said plurality of separate strips of non-transparent conductive layers are located all over a region of said transparent top side electrode layer above said substrate where said additional bottom side electrode is formed.

4. A solar cell according to claim 1 wherein said semiconductor photoelectric conversion layer comprises a crystal of copper-indium-gallium-selenide.

5. A solar cell according to claim 1 wherein said bottom side electrode layer comprises molybdenum.

6. A solar cell according to claim 1 wherein said substrate comprises soda-lime silica glass.

7. A solar cell according to claim 1 wherein material forming one of said bottom side electrode layer and said additional bottom side electrode layer is disposed in at least one of said conductive paths.

8. A solar cell according to claim 1 wherein material forming said bottom side electrode layer is disposed in at least one of said conductive paths.

9. A solar cell according to claim 1 wherein material forming said additional bottom side electrode layer is disposed in at least one of said conductive paths.

10. A solar cell according to claim 1 wherein said bottom side electrode layer and said additional bottom side electrode layer have different resistivities.

11. A solar cell according to claim 10 wherein said additional bottom side electrode layer has a lower resistivity than said bottom side electrode layer.

12. A solar cell comprising:
- a substrate of insulating material;
- a bottom side electrode formed on said substrate;
- a semiconductor photoelectric conversion layer formed on said bottom side electrode;
- a transparent top side electrode layer formed on said semiconductor photoelectric conversion layer; and
- a non-transparent electrode comprising a plurality of strips of non-transparent conductive material disposed separately from each other on said top side transparent electrode layer;
- said bottom side electrode having a composite structure including a first material disposed between one surface of the substrate and the semiconductor photoelectric conversion layer and a second, different material provided on another surface of the substrate and contacting said first material.

13. A solar cell according to claim 12, wherein said second material of said bottom side electrode being provided on a surface of said substrate opposite to said one surface, and said second material contacts said first material via a plurality of conductive paths formed to penetrate said substrate.

14. A solar cell according to claim 13, wherein said conductive paths include slits formed through said substrate and spaced from each other, and at least one of said first and second materials is disposed in said slits.

15. A solar cell according to claim 12, wherein said first and second materials of said bottom side electrode have different resistivities.

16. A solar cell according to claim 12, wherein said first material of said bottom side electrode is molybdenum and said second material of said bottom side electrode has a resistivity lower than molybdenum.

17. A solar cell according to claim 12, further comprising a buffer layer formed between said semiconductor photoelectric conversion layer and said transparent top side electrode layer.

18. A solar cell according to claim 12, wherein said semiconductor photoelectric conversion layer comprises a crystal of copper-indium-gallium-selenide.

19. A solar cell according to claim 12, wherein said substrate comprises soda-lime silica glass.

* * * * *

UNITED STATES PATENT AND TRADEMARK OFFICE
CERTIFICATE OF CORRECTION

PATENT NO.    : 6,188,013 B1
DATED         : February 13, 2001
INVENTOR(S)   : A. Inaba, K. Takebe, Y. Ishikawa It is certified that error appears in the above-identified patent and that said Letters Patent is hereby corrected as shown below:

Column 1,
Line numbered between 24 and 25, change "Cu(In,Ga)Se2" to -- $Cu(In,Ga)Se_2$ --;
Line numbered between 29 and 30, change "Cu(In,Ga) Se2" to -- $Cu(In,Ga)Se_2$ --;
Line 48, before "high" insert -- a --;
Line 53, change "it's" to -- its --.

Column 2,
Line numbered between 15 and 16, change "form" to -- from --;
Line numbered between 39 and 40, change "glass such" to -- glass, such --;
Line numbered between 50 and 51, change "along the" to -- along a --;
Line 58, after "jet" insert a comma; before "be formed" insert -- also --;
Line 61, change "to locate" to -- or located --.

Column 3,
Line 1, change "way" to -- ways --;
Line 7, before "completely" insert a comma;
Line 49, after "distance" insert -- from --;
Line 67, after "respectively" insert a comma.

Column 4,
Line 10, after "invention" insert a comma;
Line numbered between 17 and 18, change "is be" to -- is --;
Line numbered between 20 and 21, change "Intended" to -- intended --;
Line 45 (claim 2, 3rd line), change "electrode transparent top side layer" to -- transparent top side electrode layer --.

Signed and Sealed this

Sixteenth Day of October, 2001

*Attest:*

NICHOLAS P. GODICI
*Attesting Officer*    *Acting Director of the United States Patent and Trademark Office*